(12) United States Patent
Hoefler

(10) Patent No.: US 7,179,712 B2
(45) Date of Patent: Feb. 20, 2007

(54) MULTIBIT ROM CELL AND METHOD THEREFOR

(75) Inventor: Alexander B. Hoefler, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 85 days.

(21) Appl. No.: 10/640,723

(22) Filed: Aug. 14, 2003

(65) Prior Publication Data

US 2005/0037581 A1    Feb. 17, 2005

(51) Int. Cl.
*H01L 21/8236* (2006.01)

(52) U.S. Cl. .................. 438/278; 438/290; 257/390

(58) Field of Classification Search ............... 438/286, 438/181, 184, 179, 278, 290, 130, 275, 283, 438/276, 277, 279, 381–385; 257/390–393; 365/189.07, 185.03, 185.02
See application file for complete search history.

(56) References Cited

U.S. PATENT DOCUMENTS

| | | | | |
|---|---|---|---|---|
| 4,852,062 A | * | 7/1989 | Baker et al. ........... 365/185.15 |
| 5,915,178 A | * | 6/1999 | Chiang et al. .............. 438/266 |
| 5,930,629 A | * | 7/1999 | Fukumoto ................... 438/261 |
| 5,930,631 A | * | 7/1999 | Wang et al. ................ 438/286 |
| 5,960,291 A | * | 9/1999 | Krivokapic ................ 438/286 |
| 5,994,184 A | * | 11/1999 | Fukumoto ................... 438/257 |
| 5,998,265 A | * | 12/1999 | Fukimoto ................... 438/266 |
| 6,020,232 A | * | 2/2000 | Gardner et al. ............. 438/231 |
| 6,091,119 A | * | 7/2000 | Wu ............................ 257/390 |
| 6,107,160 A | * | 8/2000 | Hebert et al. ............... 438/454 |
| 6,201,282 B1 | | 3/2001 | Eitan |
| 6,344,396 B1 | * | 2/2002 | Ishida et al. ................ 438/286 |
| 6,372,587 B1 | * | 4/2002 | Cheek et al. ............... 438/302 |
| 6,479,874 B2 | * | 11/2002 | Hibino et al. .............. 257/390 |
| 6,670,247 B2 | * | 12/2003 | Hsueh ........................ 438/278 |
| 6,721,205 B2 | * | 4/2004 | Kobayashi et al. .... 365/185.26 |
| 2003/0025151 A1 | * | 2/2003 | Yoo ........................... 257/315 |
| 2003/0027389 A1 | * | 2/2003 | Yi et al. ..................... 438/257 |
| 2003/0119334 A1 | * | 6/2003 | Kwak et al. ................ 438/775 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—Brook Kebede
*Assistant Examiner*—Khiem D. Nguyen
(74) *Attorney, Agent, or Firm*—James L. Clingan, Jr.; Kim-Marie Vo

(57) ABSTRACT

To increase the density of memory cells, a multibit memory cell (10, 50, 80, 110) can be manufactured by preventing the formation of at least one of the extension regions usually formed for the source or drain region. In one embodiment, a single mask (24) blocks the doping of the extension regions during ion implantation. If a tilt implantation process is used to form desired extension regions, two masks may be used. The process can also be integrated into a disposable spacer process. By blocking the extension region for a current electrode, a programmable region (32, 76, 102, 132) is formed adjacent a current electrode. The programmable region enables a two-bit memory cell to be formed.

25 Claims, 5 Drawing Sheets

MULTIBIT ROM CELL AND METHOD THEREFOR

FIELD OF THE INVENTION

This invention relates to integrated circuit ROMs, and more particularly, to ROMs having more than one bit per cell.

RELATED ART

A continuing desire in the semiconductor industry is to have more and more memory, including read only memory (ROM) on an integrated circuit. In addition to the continuing shrinking in size of transistors to achieve this, multibit cells also provide for increased memory for a given amount of space on an integrated circuit. One of the main difficulties is providing a memory cell that is made in a manner that is compatible with existing processes while maintaining adequate cell performance. This is especially important for a ROM that is embedded on the same die as a microcontroller or other logic circuit. The ROM in such case is preferably made with the same steps as are used in making the other circuit. The programming techniques commonly used in single-bit-per-cell ROMs use steps compatible with the logic but that has been difficult to achieve in the multibit situation.

Thus, there is a need for a multibit ROM that is conveniently used in embedded applications.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one form, multibit per cell is achieved by selectively providing or not providing an extension implant to either side of the channel. The regular heavily doped implant is provided on both sides in its normal position, which is spaced from the channel region. This space, in a typical transistor, is occupied with an extension implant that provides conduction between the channel and the heavily doped region. In the absence of this extension implant on the source side the transistor is effectively non-conducting even when a voltage is applied to the gate and the drain. This extension implant, on the drain side, however, does not have to be present in order for the transistor to be conducting. A voltage applied to the drain has the electrical effect of extending the drain region to the channel. Thus the transistor is operated with one side of the channel as the drain for one bit cell and as the source for a second bit cell. This is better understood by reference to the FIGs. and the following description.

Figure 1:
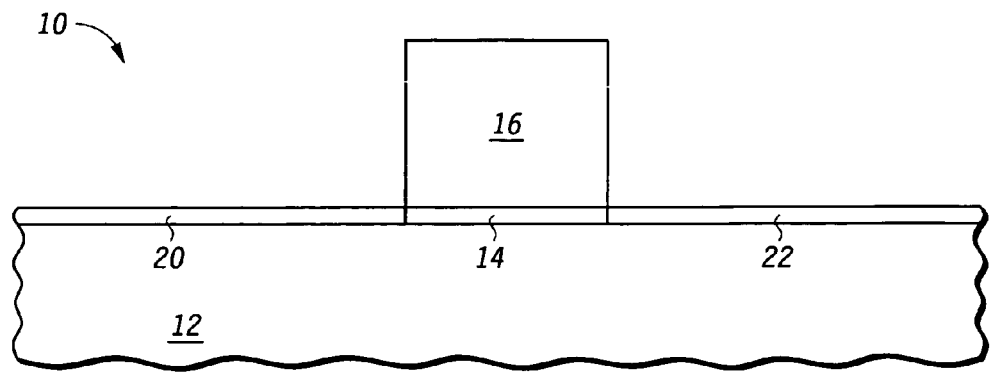
FIGS. 1–5 are cross sections of a semiconductor device according to an embodiment of the invention at sequential stages in processing.

Shown in FIG. 1 is a semiconductor device 10, which will become a two bit memory cell, comprising a semiconductor substrate 12, a gate dielectric 14 on substrate 12, a gate 16 on gate dielectric 14, and insulating layers 20 and 22 on substrate 12 and adjacent to gate dielectric 14. This is a conventional structure in MOS processes and depicts one of many such structures that would be used to form a read only memory (ROM) on a semiconductor die. The materials may be any that are useful for this purpose. For example substrate 12 may be the upper semiconductor layer of a SOI substrate. Gate dielectric may be silicon oxide but could be any appropriate gate dielectric material such as a high dielectric layer such as hafnium oxide. Similar gate 16 may be of polysilicon but could be another material such as metal or could be a composite of materials appropriate for a gate. Insulating layers 20 and 22 may be silicon oxide but could also be another material, especially a material appropriate for protecting substrate 12 during an implant step.

Figure 2:
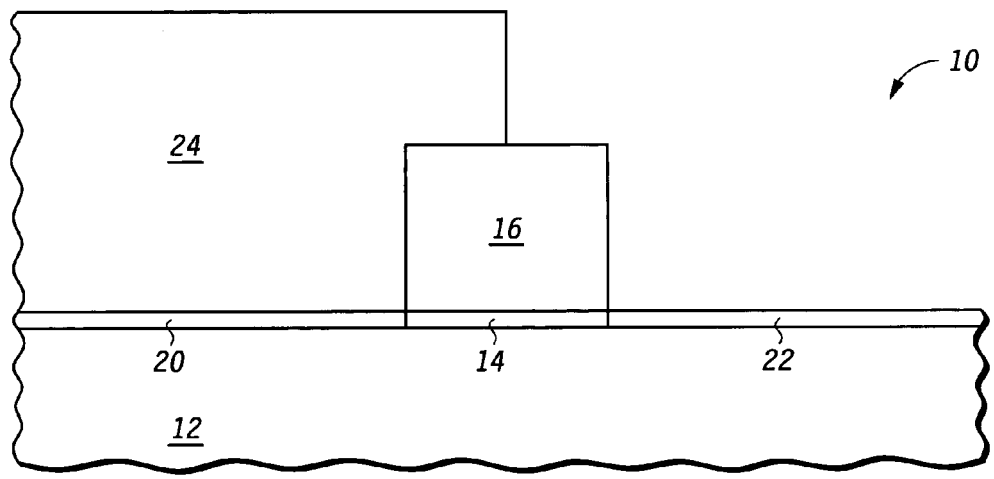

Shown in FIG. 2 is a photoresist layer 24 that has been patterned to expose dielectric layer 22 while covering dielectric layer 20. Photoresist layer 24 thus should be patterned so that the edge shown in FIG. 2 is located over gate 16.

Figure 3:
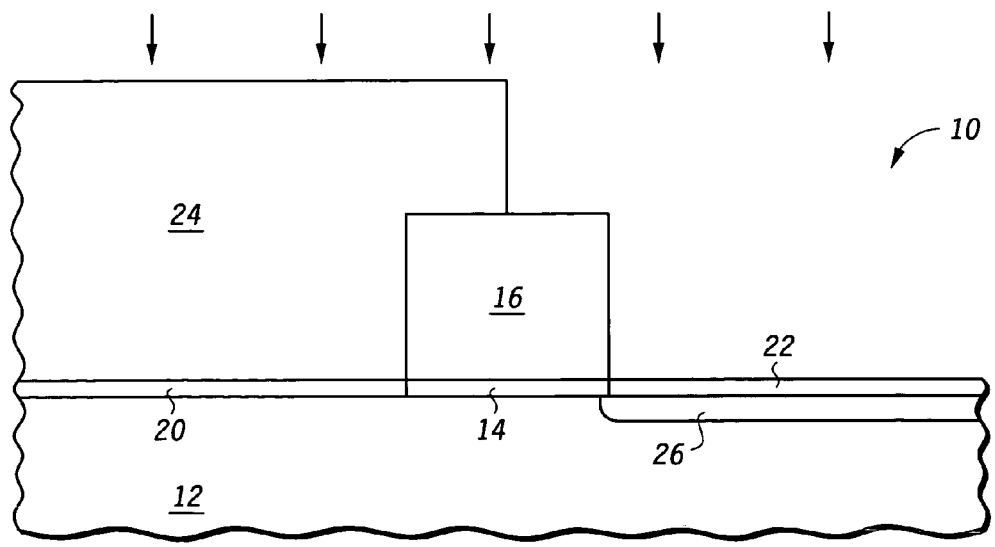

Shown in FIG. 3 is the result of an implant using photoresist layer 24 as a mask. The result is a doped region 26 along the surface of substrate 12 under insulating layer 22. The implant itself is an extension implant. In this case, N channel transistors are being formed so that this implant may be arsenic, or another N-type dopant such as phosphorus or antimony, or a combination thereof. A halo implant, consisting of boron or indium or a combination of theses impurities, may also be performed at this point. The halo implant could also be before photoresist layer 24 is deposited. Photoresist layer 24 performs the function of the programming mask that determines the states of two bit cells by determining the presence or non-presence of the extension implant on each side of gate 16.

Figure 4:
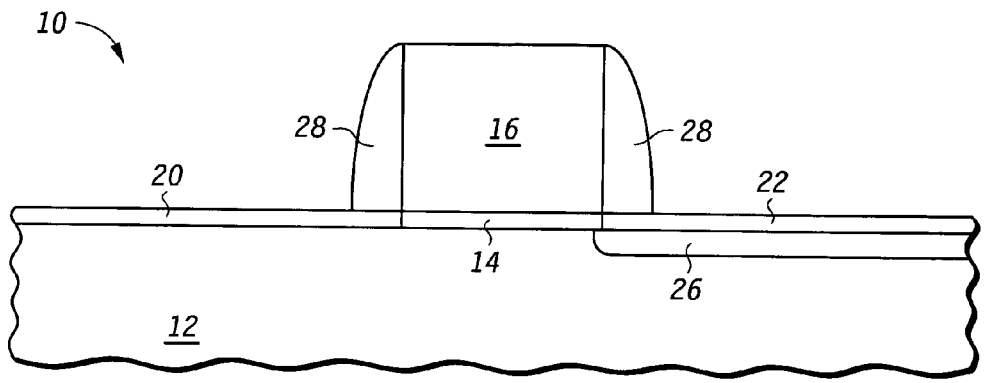

FIG. 4 shows semiconductor structure 10 after sidewall spacers 28 have been formed on gate 16.

Figure 5:
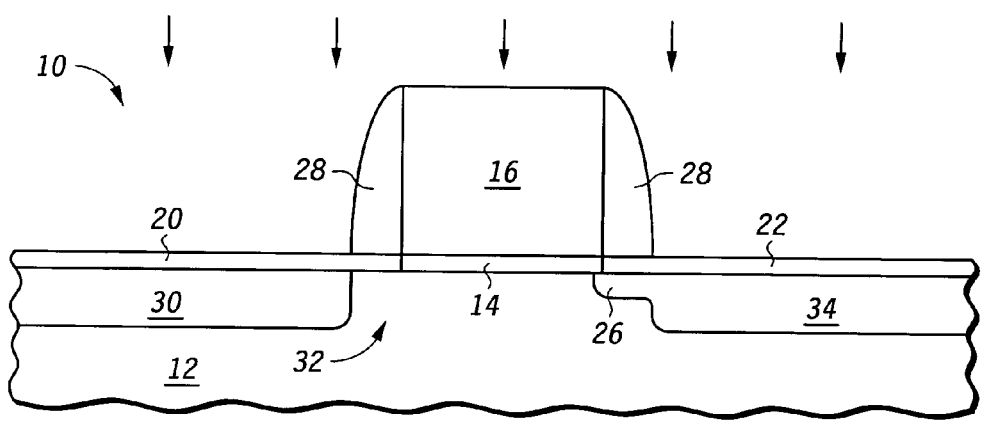

FIG. 5 shows semiconductor 10 after a source/drain implant forms relatively heavily doped region 30 formed under insulating layer 20 and spaced from gate 16 on one side and relatively heavily doped region 34 under dielectric 22 and spaced from gate 16 on another side. Additional thermal processing steps may be required, but semiconductor structure 10 as shown in FIG. 5 is a functional two bit memory cell. The space between gate 16 and doped region 30 is shown as programming region 32. The remaining portion of extension implant 26 shown in FIG. 5 is the programming region for the side of gate 16 that has doped region 34. Programming region 32 and extension implant 26 could be viewed as the two bit of the memory cell. Programming region 32, being a gap between gate 16 and doped region 30 causes semiconductor device to be non-conductive, even when a voltage is applied to gate 16, when doped region 34 is operated as the drain. On the other hand when doped region 30 is operated as the drain, the N-type characteristic of doped region 30 is extended electrically toward gate 16 so that there is no gap, electrically, between doped region 30 operated as a drain and the channel region under gate 16. The gap is bridged electrically during the read operation through an effect that is referred to as depletion, which is commonly observed around junctions between doped regions in semiconductors that are of opposite conductivity type. Thus, when doped region 30 is operated as a drain, the state of programming region 32 is not relevant so that the presence or non-presence of extension 26 can be detected.

Figure 6:
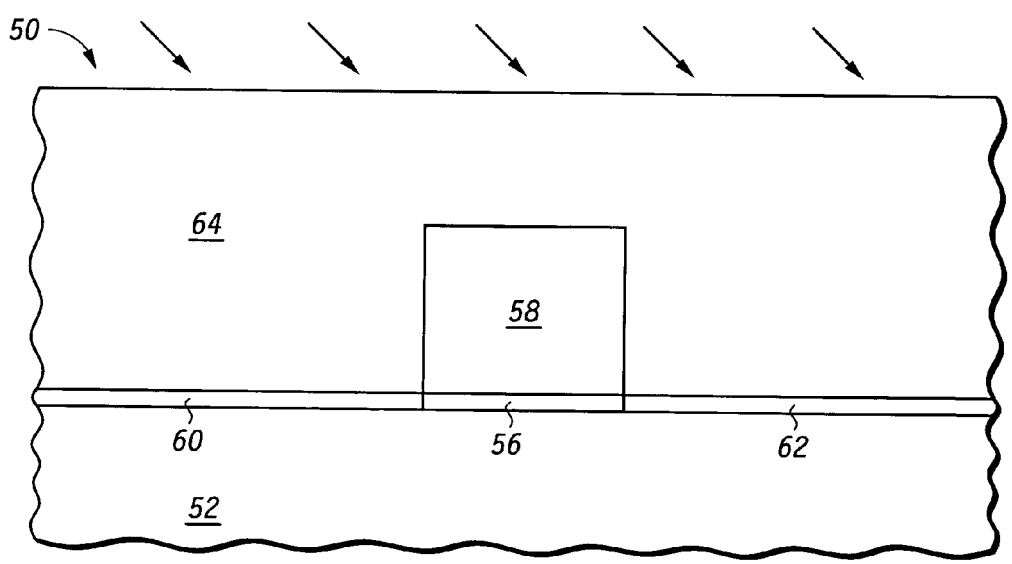
FIGS. 6–9 are cross sections of a semiconductor device according to another embodiment of the invention at sequential stages in processing.

Shown in FIG. 6 is a device structure 50, to become a two bit memory cell, comprising a substrate 52, a gate dielectric 56 on substrate 52, a gate 58 over gate dielectric 56, an insulating layer 60 over substrate 52 and adjacent gate 58, and an insulating layer 62 over substrate 52 and adjacent gate 58. Also shown in FIG. 6 is a photoresist layer 64 over device structure 50. In this case, device structure 50 is one of many such device structures on a semiconductor die. Some, such as semiconductor device 50, are covered with photoresist and others are not. Photoresist layer 64 just needs to cover the gate and the area immediately surrounding it and thus the precision required for the photoresist definition process is very low. Photoresist layer 64 is present to block an angled implant from reaching device structure 50. Other device structures on the die would not be covered by photoresist and would receive the implant. The presence or non-presence of the photoresist layer 64 over device structure 50 is the programming step for the bit cell that has its state determined by the doping condition immediately adjacent to gate 58 on the side where insulating layer 60 is present. The angle of this implant is from left to right.

Figure 7:
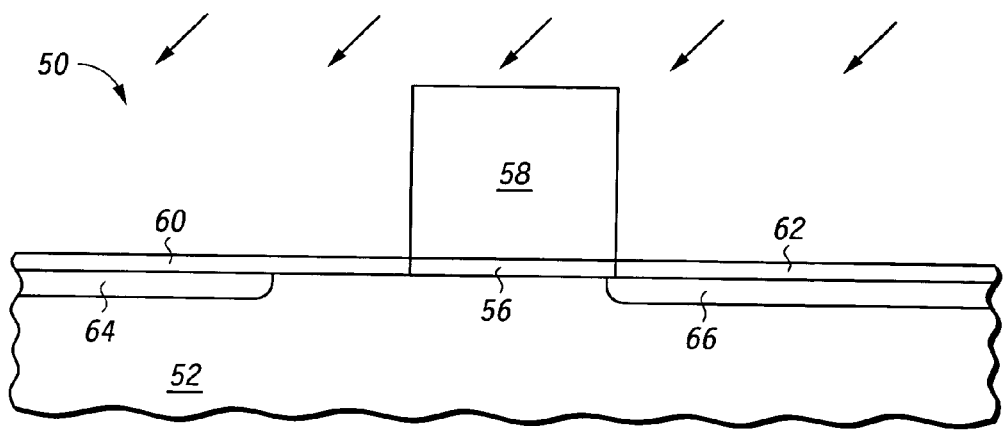

Shown in FIG. 7 is semiconductor device 50 after removing photoresist layer 64 and performing another angled extension implant to form relatively lightly doped regions 64 and 66. This time the angled implant is partially blocked by the gate 58. Thus, doped region 64 is spaced from gate 58 while region 66 is formed a little under gate 58. Other devices present on the same die as semiconductor device 50 would be covered with photoresist so that doped regions analogous to doped region 66 would not be formed. This FIG. 7 shows the effect of not having photoresist over the device structure in the presence of an angled implant. The presence or non-presence of the photoresist layer over device 50 for this angled implant is the programming step for the bit cell that has its state determined by the doping condition immediately adjacent to gate 58 on the side where insulating layer 62 is present. The angle of the implant is from right to left and is measured from the vertical (zero degrees) and is preferably less than 45 degrees. Preferably the angle is between 10 and 30 degrees. The angle is chosen to achieve enough shadowing by gate 58 so that doped region 64 is sufficiently spaced from gate 58.

Figure 8:
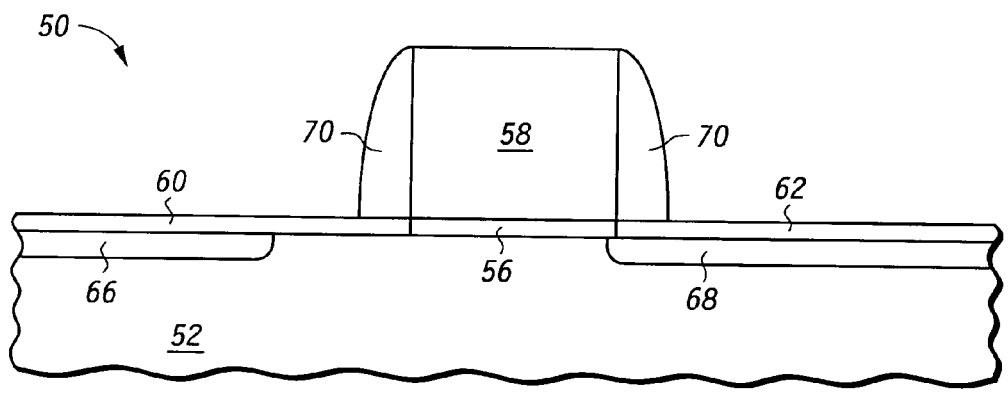

Shown in FIG. 8 is semiconductor device 50 after formation of sidewall spacers 70 around gate 58.

Figure 9:
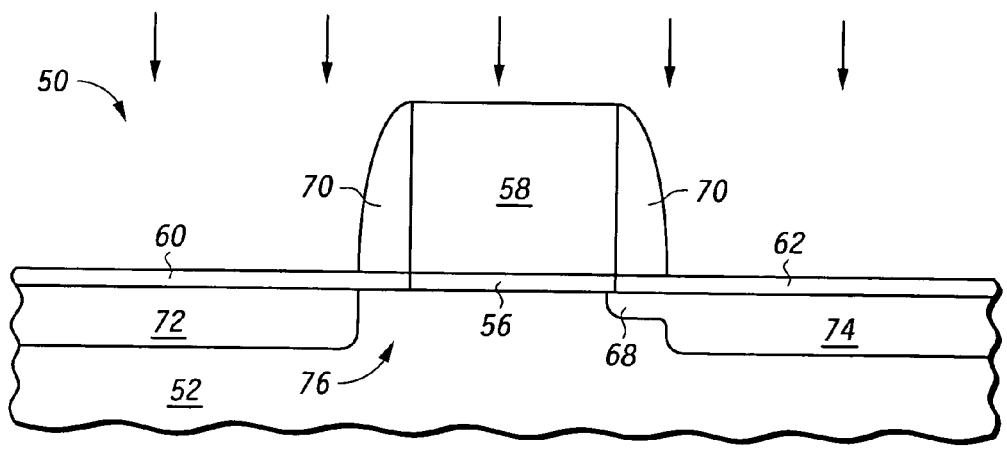

Shown in FIG. 9 is semiconductor device 50 after implanting relatively heavily doped regions 72 and 74 using sidewall spacers 70 as a mask. Additional thermal processing steps may be required, but structurally this results in a functional memory cell having two states. Doped region 72 is thus spaced from gate 70 by a programming region 76. Programming region 76 defines the state of one bit of the memory cell, which is semiconductor device 50 of FIG. 9. Similarly, doped region 68 defines the state of the other bit of the memory cell. The operation is the same as for the memory cell of FIG. 5.

Figure 10:
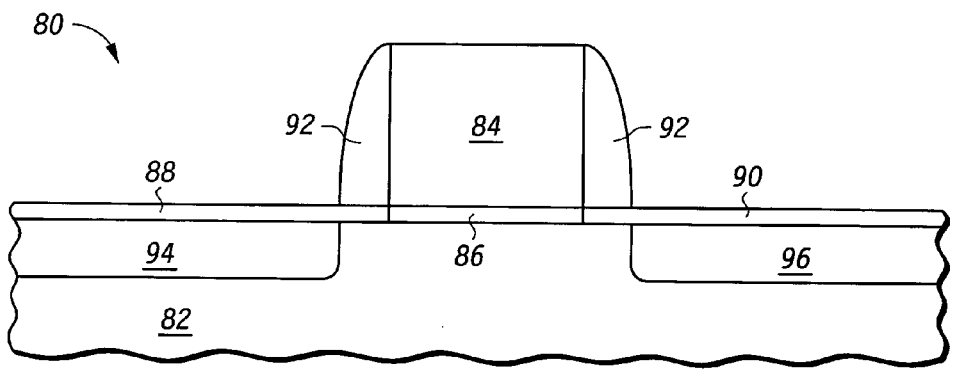
FIGS. 10–11 are cross sections of a semiconductor device according to yet another embodiment of the invention at sequential stages in processing.

Shown in FIG. 10 is device structure 80, to become a two bit memory cell, comprising a substrate 82, a gate dielectric 86 on substrate 82, a gate 84 over gate dielectric 86, an insulating layer 88 over substrate 82 and adjacent gate 84, an insulating layer 80 over substrate 82 and adjacent gate 84, a relatively heavily doped region 94 at the surface of substrate 82 adjacent sidewall spacer 92, and a relatively heavily doped region 96 at the surface of substrate 82 and adjacent to sidewall spacer 92.

Figure 11:
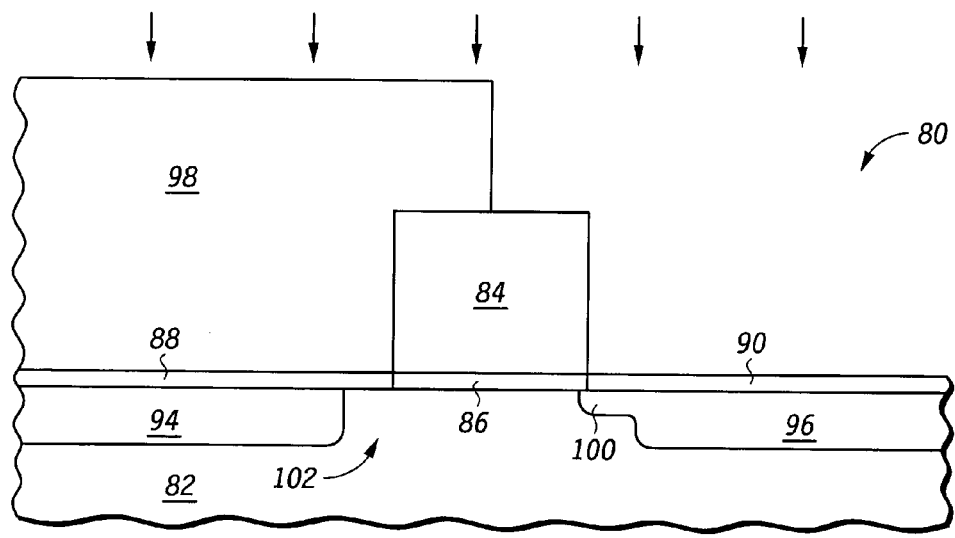

Shown in FIG. 11 is semiconductor device 80 after formation of a photoresist layer 64 over insulating layer 88 and a portion of gate 84. An implant follows after formation of photoresist layer 98 using photoresist layer 98 as a mask to form extension region 100. Other thermal processing steps may be required, but structurally, the resulting device structure of FIG. 11 is a functional two bit memory cell. This use of mask 98 is a programming step for the memory cell. The two areas of consequence for programming are the regions immediately adjacent to gate 84; programming regions 102 and 100. In the case of programming region 102, conductivity is blocked when doped region 96 is acting as a drain. On the other hand, normal transistor operation is achieved when doped region 124 is treated as the drain.

Figure 12:
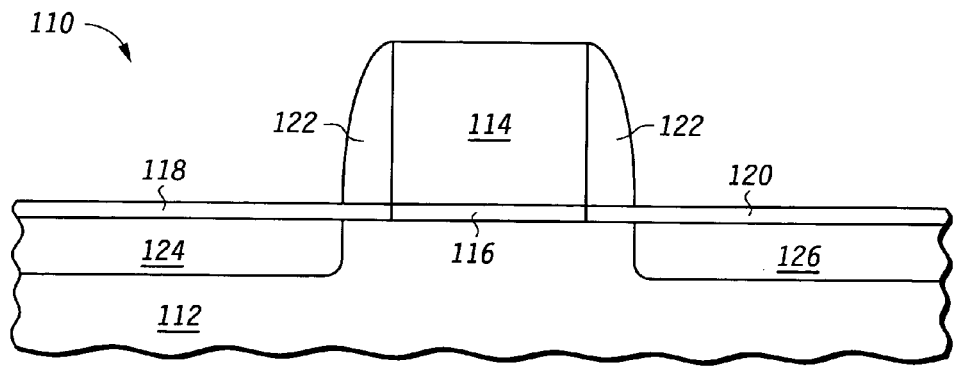
FIGS. 12–14 are cross sections of a semiconductor device according to even yet another embodiment of the invention at sequential stages in processing.

Shown in FIG. 12 is a semiconductor device 110, to become a two bit memory cell, comprising a substrate 112, a gate dielectric 116 on substrate 112, a gate 114 over gate dielectric 116, an insulating layer 118 over substrate 112 and adjacent gate 114, an insulating layer 120 over substrate 112 and adjacent gate 114, a relatively heavily doped region 124 at the surface of substrate 112 adjacent sidewall spacer 122, and a relatively heavily doped region 126 at the surface of substrate 112 and adjacent to sidewall spacer 122. As in the other examples, semiconductor device 110 is one of many semiconductor devices formed on a semiconductor die.

Figure 13:
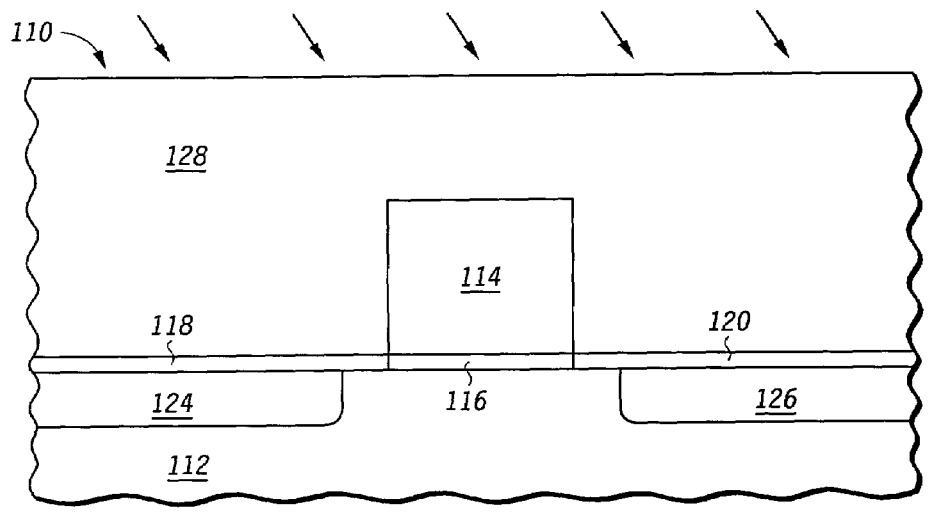

Shown in FIG. 13 is semiconductor device 110 after formation of a photoresist layer 128 over semiconductor device 110. An angled implant analogous to that performed as shown in FIG. 6 is performed. Other locations on the die would not be covered by photoresist. This is one of two programming steps achieved by photoresist steps that do not require close tolerances. For those semiconductor devices being programmed to not receive this implant, what is significant is that the area immediately surrounding gate 114 should be covered.

Figure 14:
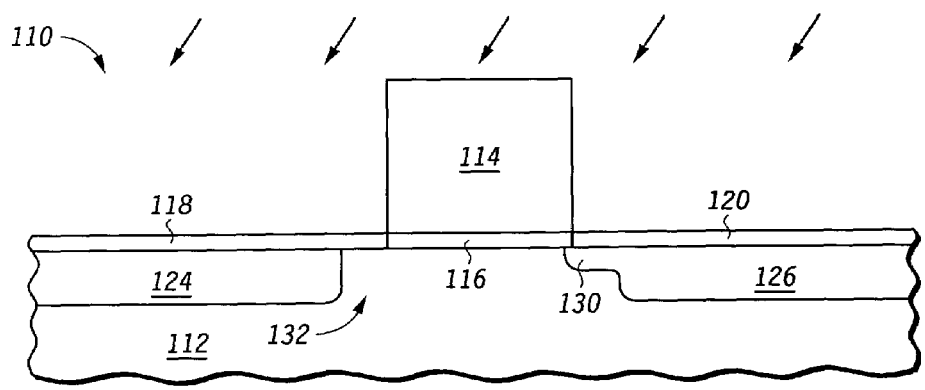

Shown in FIG. 14 is semiconductor device 110 after another programming step that in this case is another implanting step in which are semiconductor devices are selectively covered with photoresist. In this case, semiconductor device 110 is not covered by photoresist so that a region 130, which is relatively lightly doped, is formed adjacent to and merged with doped region 126 and extends a little under gate 114. Although additional thermal processing is likely required, the structure shown in FIG. 14 is that of a functional two bit memory cell. Shown is a programming region 132 that is a gap in N-type doping between doped region 124 and gate 114. As described before the presence or non-presence of N-type doping in the form of an extension implant between the relatively heavily doped regions provides for either conductivity or non-conductivity when region 124 is operated as a source.

The distance between the relatively heavily doped regions and the gate (programming region), is important in providing enough distance that the gate bias does not extend to invert that programming region. On the other hand this distance that characterizes the programming region must be small enough that when the heavily doped region is operated as the drain, the heavily doped region must be extended electrically to allow conductivity from the channel. A sidewall spacer provides for the mask for the implant of the relatively heavily doped regions so that the distance is set by the sidewall spacer, and fortunately there is minimal migration under the subsequent thermal processing steps that are needed to activate the implants. Thus, the sidewall spacer width, background doping level of the substrate, thermal processing, and doping level of the relatively heavily doped regions are the primary factors in controlling the distance of the programming region. One example of such suitable parameters are a width of the sidewall spacer of 700 Angstroms, doping level of the heavily doped regions at about 10 to the $21^{st}$ power of arsenic atoms per cubic centimeter, and background doping of the silicon substrates at about 10 to the $18^{th}$ power of boron atoms per cubic centimeter. A representative example of a thermal processing step would consist of a five second anneal at 1000 degrees Celsius. These steps were found to be effective for the case in which the gate and drain voltages were 1.2 volts with a grounded source and substrate.

These embodiments show that a process for a multibit memory cell can be integrated easily into a logic process for making commonly made MOS transistors. The extension implant is a step used in the vast majority of MOS integrated circuits. These embodiments take advantage of this known step to use it for programming a multibit memory cell. If the logic uses a removable spacer, this programming approach can be used consistent with that. If a non-critical mask is required, this programming approach can be used consistent with that.

Figure 15:
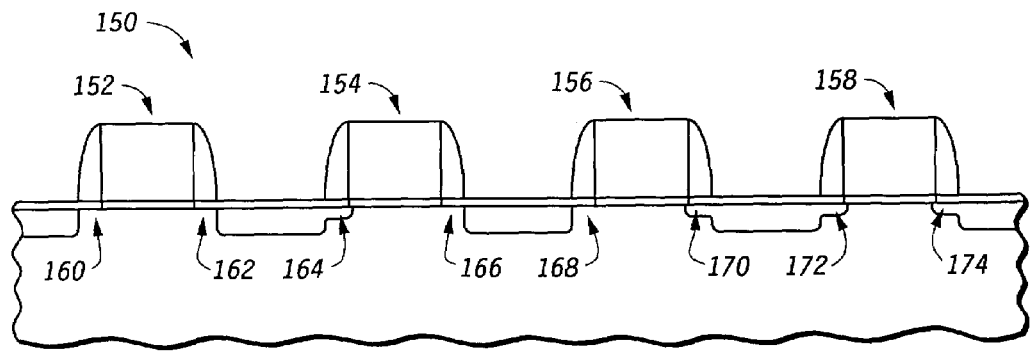
FIG. 15 is a cross section showing programming combinations for four cells relevant to the embodiments shown in FIGS. 1–14.

Shown in FIG. 15 is a row of exemplary memory cells 152, 154, 156, and 158 each having two bits. Memory cell 152 has programming regions 160 and 162 that both are with non-present extension implants. Memory cell 154 has a programming region 164 on the left that is with the extension implant being present and a programming region 166 on the right that is with the extension implant being non-present. Memory cell 156 has a programming region 168 on the left with the extension implant being non-present and a programming region on the right with the extension implant being present. Memory cell 158 has both programming regions 172 and 174 with the extension implants being present.

In the foregoing specification, the invention has been described with reference to specific embodiments. However, one of ordinary skill in the art appreciates that various modifications and changes can be made without departing from the scope of the present invention as set forth in the claims below. For example, the embodiments have been described with the substrates being silicon of the P-type and the implanted regions have been doped to N-type. These could, however, be reversed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for selectively programming a first bit and a second bit of a memory cell, wherein the memory cell comprises:
   a semiconductor substrate;
   a gate stack having a first sidewall opposite a second sidewall;
   a first doped region within the semiconductor substrate separated from the first sidewall of the gate stack by a first programming region; and
   a second doped region within the semiconductor substrate and substantially adjacent the second sidewall of the gate stack, wherein:
      the second doped region and the first doped region are of the same conductivity type; and
      the second doped region is separated from the second sidewall of the gate stack by a second programming region;
wherein the method comprises:
   selectively implanting into the first programming region to determine a logic state of the first bit; and
   selectively implanting into the second programming region to determine the logic state of the second bit.

2. The method of claim 1, further comprising:
   forming a first masking layer over the second programming region prior to the step of selectively implanting into the first programming region.

3. The method of claim 1, wherein the first doped region is formed concurrently with the second doped region.

4. The method of claim 1, further comprising:
   forming a first photoresist layer over the semiconductor substrate prior to the step of implanting into the first programming region;
   removing the first photoresist layer after the step of implanting into the first photoresist layer;
   forming a first sidewall spacer over the semiconductor substrate and adjacent the first sidewall of the gate stack and a second sidewall spacer over the semiconductor substrate and adjacent the second sidewall of the gate stack, wherein forming the first sidewall spacer and the second sidewall spacer is performed before the first doped region and the second doped region are formed.

5. The method of claim 4, wherein the step of selectively implanting into the first programming region is performed substantially perpendicular to the semiconductor substrate.

6. The method of claim 1, wherein the step of selectively implanting into the first programming region is performed at no greater than approximately forty-five degrees with respect to a normal of the semiconductor substrate.

7. The method of claim 1, further comprising:
   forming a first sidewall spacer over the semiconductor substrate and adjacent the first sidewall of the gate stack and forming a second sidewall spacer over the semiconductor substrate and adjacent the second sidewall of the gate stack, wherein the first sidewall spacer and second sidewall spacer are formed prior to the second doped region being formed; and
   removing the first sidewall spacer and the second sidewall spacer prior to step of selectively implanting into the first programming region.

8. The method of claim 7, further comprising:
   forming a first photoresist layer over the second programming region after removing the first sidewall spacer and the second sidewall spacer; and removing the first photoresist layer after the step of selectively implanting into the first programming region; and wherein the step of selectively implanting into the first programming region is performed substantially perpendicular to the semiconductor substrate.

9. The method of claim 7, wherein the step of selectively implanting into the first programming region is preformed at no greater than approximately forty-five degrees with respect to a normal of the semiconductor substrate.

10. A method for forming a memory cell and a method for programming the memory cell, wherein the method of forming the memory cell comprises:

providing a semiconductor substrate;

forming a gate stack having a first sidewall opposite a second sidewall, wherein forming the gate stack comprises:

forming a gate dielectric over the semiconductor substrate; and forming a control electrode over the gate dielectric;

forming a first doped region within the semiconductor substrate separated from the first sidewall of the gate stack by a first programming region; and forming a second doped region within the semiconductor substrate and substantially adjacent the second sidewall of the gate stack, wherein:

the second doped region and the first doped region are of the same conductivity type; and the second doped region is separated from the second sidewall of the gate stack by a second programming region;

wherein the method of programming the memory cell comprises:

selectively implanting into the first programming region to determine a logic state of the first bit; and selectively implanting into the second programming region to determine the logic state of the second bit.

11. The method of claim 10, further comprising:

forming a first masking layer over the second programming region prior to the step of selectively implanting into the first programming region.

12. The method of claim 10, wherein the step of forming the first doped region is performed concurrently with the step of forming the second doped region.

13. The method of claim 10, further comprising:

forming a first photoresist layer over the semiconductor substrate prior to performing the step of implanting into the first programming region;

removing the first photoresist layer after performing the step of implanting into the first photoresist layer;

forming a first sidewall spacer over the semiconductor substrate and adjacent the first sidewall of the gate stack and a second sidewall spacer over the semiconductor substrate and adjacent the second sidewall of the gate stack, wherein forming the first sidewall spacer and the second sidewall spacer is performed before the first doped region and the second doped region are formed.

14. The method of claim 13, wherein the step of selectively implanting into the first programming region is performed substantially perpendicular to the semiconductor substrate.

15. The method of claim 10, wherein the step of selectively implanting into the first programming region is performed at no greater than approximately forty-five degrees with respect to a normal of the semiconductor substrate.

16. The method of claim 10, further comprising:

forming a first sidewall spacer over the semiconductor substrate and adjacent the first sidewall of the gate stack and forming a second sidewall spacer over the semiconductor substrate and adjacent the second sidewall of the gate stack, wherein the first sidewall spacer and second sidewall spacer are formed prior to the second doped region being formed; and removing the first sidewall spacer and the second sidewall spacer prior to step of selectively implanting into the first programming region.

17. The method of claim 16, further comprising:

forming a first photoresist layer over the second programming region after removing the first sidewall spacer and the second sidewall spacer; and removing the first photoresist layer after the step of selectively implanting into the first programming region; and wherein the step of selectively implanting into the first programming region is performed substantially perpendicular to the semiconductor substrate.

18. The method of claim 16, wherein the step of selectively implanting into the first programming region is performed at no greater than approximately forty-five degrees with respect to a normal of the semiconductor substrate.

19. A method of forming a memory cell comprising a first bit and a second bit that are programmed, comprising:

providing a semiconductor substrate;

forming a gate stack having a first sidewall opposite a second sidewall, wherein forming the gate stack comprises:

forming a gate dielectric over the semiconductor substrate; and forming a control electrode over the gate dielectric;

selecting between performing and not performing a first implant, wherein the first implant is into a first programming region within the semiconductor substrate and substantially adjacent the first sidewall of the gate stack to program the first bit to a first logic state;

forming a first heavily-doped region within the semiconductor substrate and separated from the first sidewall of the gate stack by the first programming region;

selecting between performing and not performing a second implant, wherein the second implant is into a first programming region within the semiconductor substrate and substantially adjacent the second sidewall of the gate stack to program the second bit to the first logic state; and forming a second heavily-doped region within the semiconductor substrate and separated from the second sidewall of the gate stack by the second programming region, wherein:

the second heavily-doped region and the first heavily-doped region are of the same conductivity type.

20. The method of claim 19, further comprising:

forming a first photoresist layer over the second programming region prior to performing the step of selectively implanting the first programming region;

removing the first photoresist layer after performing the step of selectively implanting the first programming region;

forming a first sidewall spacer over the semiconductor substrate and adjacent the first sidewall of the gate stack;

forming a second sidewall spacer over the semiconductor substrate and adjacent the second sidewall of the gate stack, wherein forming the first sidewall spacer and the second sidewall spacer is performed before forming the first heavily-doped region and the second heavily-doped region.

21. The method of claim 20, wherein the step of selectively implanting the first programming region is performed using a first ion implant at an angle that is substantially perpendicular to the semiconductor substrate.

22. The method of claim 20, wherein the step of selectively implanting the first programming region is performed using an ion implant at an angle that is no greater than approximately forty-five degrees with respect to a normal of the semiconductor substrate.

23. The method of claim 19, further comprising:
forming a first sidewall spacer over the semiconductor substrate and adjacent the first sidewall of the gate stack, wherein the first sidewall spacer is formed prior to forming the first heavily-doped region;
forming a second sidewall spacer over the semiconductor substrate and adjacent the second sidewall of the gate stack, wherein forming the first sidewall spacer and the second sidewall spacer is performed before forming the first heavily-doped region and the second heavily-doped region; and
removing the first sidewall spacer and the second sidewall spacer after forming the first heavily-doped region and the second heavily-doped region.

24. The method of claim 23, further comprising:
forming a first photoresist layer over the second programming region after removing the first sidewall spacer and the second sidewall spacer; and
removing the first photoresist layer after selecting between performing and not performing the first implant; and
wherein the first implant is performed using a first ion implant that is substantially perpendicular to the semiconductor substrate.

25. The method of claim 23, wherein the step of selecting between performing and not performing the first implant is performed using an ion implant at an angle that is no greater than approximately forty-five degrees with respect to a normal of the semiconductor substrate.

* * * * *